United States Patent
Chiu et al.

(10) Patent No.: US 10,256,187 B2
(45) Date of Patent: Apr. 9, 2019

(54) SEMICONDUCTOR DEVICE WITH SLOTTED BACKSIDE METAL FOR IMPROVING Q FACTOR

(71) Applicant: WIN Semiconductors Corp., Tao Yuan (TW)

(72) Inventors: Jui-Chieh Chiu, Taoyuan (TW); Chih-Wen Huang, Taoyuan (TW); You-Cheng Lai, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 15/594,672

(22) Filed: May 15, 2017

(65) Prior Publication Data

US 2018/0331031 A1    Nov. 15, 2018

(51) Int. Cl.
  *H01L 23/522* (2006.01)
  *H01L 49/02* (2006.01)
  *H01L 23/66* (2006.01)

(52) U.S. Cl.
  CPC .......... *H01L 23/5227* (2013.01); *H01L 23/66* (2013.01); *H01L 28/10* (2013.01)

(58) Field of Classification Search
  CPC ..... H01L 23/5227; H01L 23/66; H01L 28/10; H01L 29/1608; H01L 29/20; H01L 29/737; H01L 29/7786
  See application file for complete search history.

(56) References Cited

U.S. PATENT DOCUMENTS

| | | | |
|---|---|---|---|
| 2008/0020488 A1* | 1/2008 | Clevenger | H01L 21/76898 438/3 |
| 2010/0245012 A1 | 9/2010 | Chang | |
| 2012/0258594 A1* | 10/2012 | Barth | H01L 21/76898 438/667 |
| 2013/0140672 A1* | 6/2013 | Sato | H01L 23/5227 257/531 |
| 2016/0261036 A1* | 9/2016 | Sato | G01S 7/02 |
| 2016/0285420 A1 | 9/2016 | Jones | |
| 2017/0025349 A1* | 1/2017 | Wood | H01L 21/76898 |

* cited by examiner

*Primary Examiner* — Yasser A Abdelaziez

(74) *Attorney, Agent, or Firm* — Winston Hsu

(57) ABSTRACT

A semiconductor device is disclosed. The semiconductor device includes a semiconductor substrate; a winding structure formed on a top side the semiconductor substrate, wherein the winding structure comprises one or more metal lines winding with respect to a center of the winding structure; and a backside metal formed under a backside of the semiconductor substrate; wherein a hollow slot is formed within the backside metal, and a projection of the winding structure is within the hollow slot.

19 Claims, 6 Drawing Sheets

SEMICONDUCTOR DEVICE WITH SLOTTED BACKSIDE METAL FOR IMPROVING Q FACTOR

BACKGROUND OF THE INVENTION

1. Field of the Invention

The present invention relates to a semiconductor device, and more particularly, to a semiconductor device capable of enhancing quality factor by forming a slot within a backside metal therein.

2. Description of the Prior Art

Front-end modules (FEMs) are used in radio frequency (RF) applications, and inductors are usually required for the FEMs. Performance of these FEMs depends heavily on the quality factor Q of the inductor, where poor quality factor Q of an inductor leads to degradation in circuit efficacy, especially at RF or microwave frequencies. The Q factor is defined as Q=2π*(energy-stored)/(energy-loss-in-one-oscillation-circle). The Q factor degrades at high frequencies due to energy dissipation in the semiconductor substrate.

In the prior art, an additional integrated passive device (IPD) with a thick backside metal is deployed for obtaining higher Q factor, which raises a production cost and increases an area of the FEM. Therefore, it is necessary to improve the prior art.

SUMMARY OF THE INVENTION

It is therefore a primary objective of the present invention to provide a semiconductor device capable of enhancing quality factor by forming a slot within a backside metal therein, to improve over disadvantages of the prior art.

An embodiment of the present invention discloses a semiconductor device. The semiconductor device comprises a semiconductor substrate; a winding structure formed on a top side the semiconductor substrate, wherein the winding structure comprises one or more metal lines winding with respect to a center of the winding structure; and a backside metal formed under a backside of the semiconductor substrate; wherein a hollow slot is formed within the backside metal, and a projection of the winding structure is within the hollow slot.

An embodiment of the present invention further discloses a manufacturing method of a semiconductor device. The manufacturing method comprises forming a winding structure formed on a top side of a semiconductor substrate; forming a backside metal under a backside of the semiconductor substrate; and forming a hollow slot within the backside metal, wherein a projection area of the winding structure is within the hollow slot. The winding structure comprises one or more metal lines winding with respect to a center of the winding structure, and the one or more metal lines are disposed in one or more metal layers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
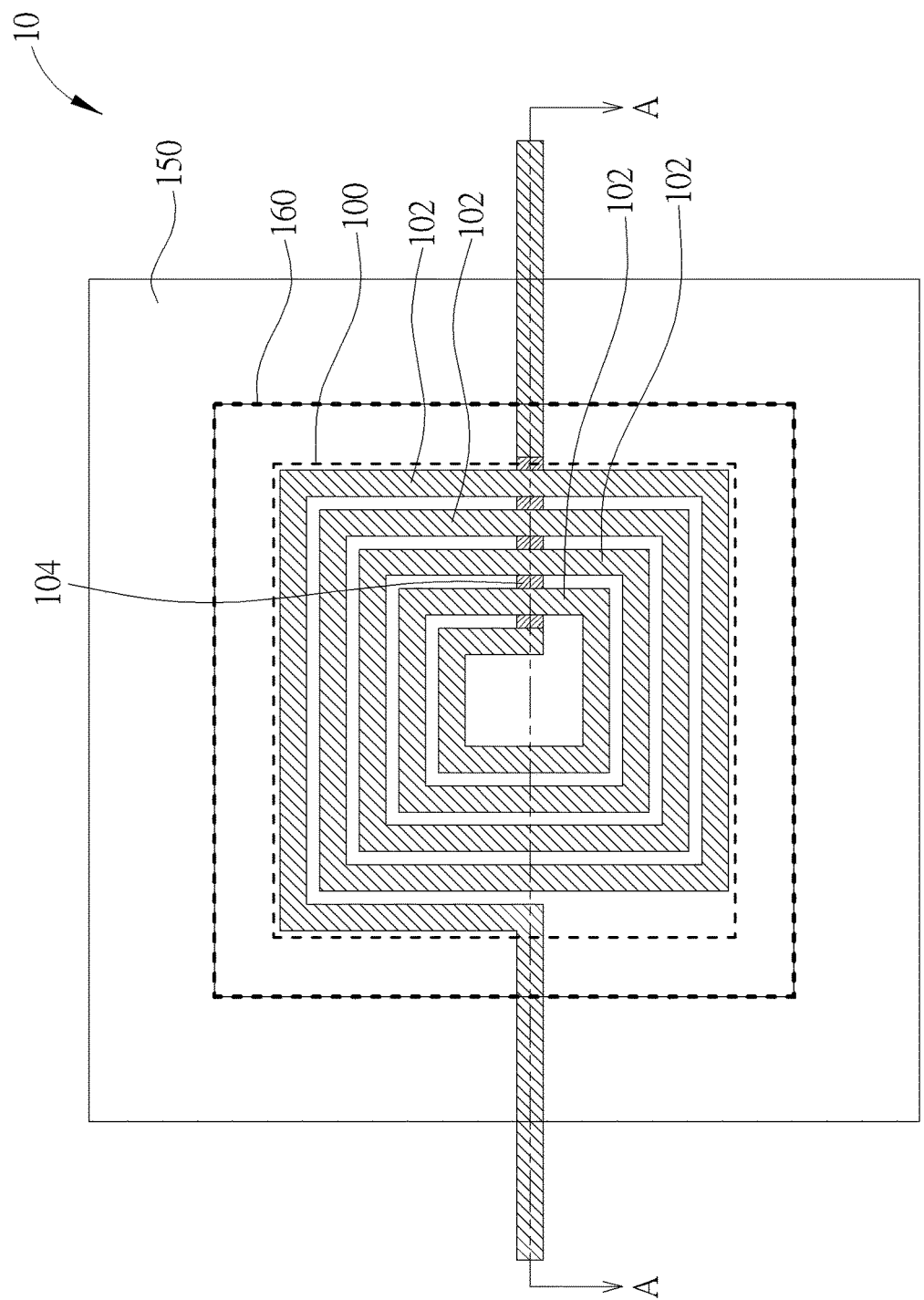
FIG. 1 is a schematic diagram of a layout view of a semiconductor device according to an embodiment of the present invention.
Figure 2:
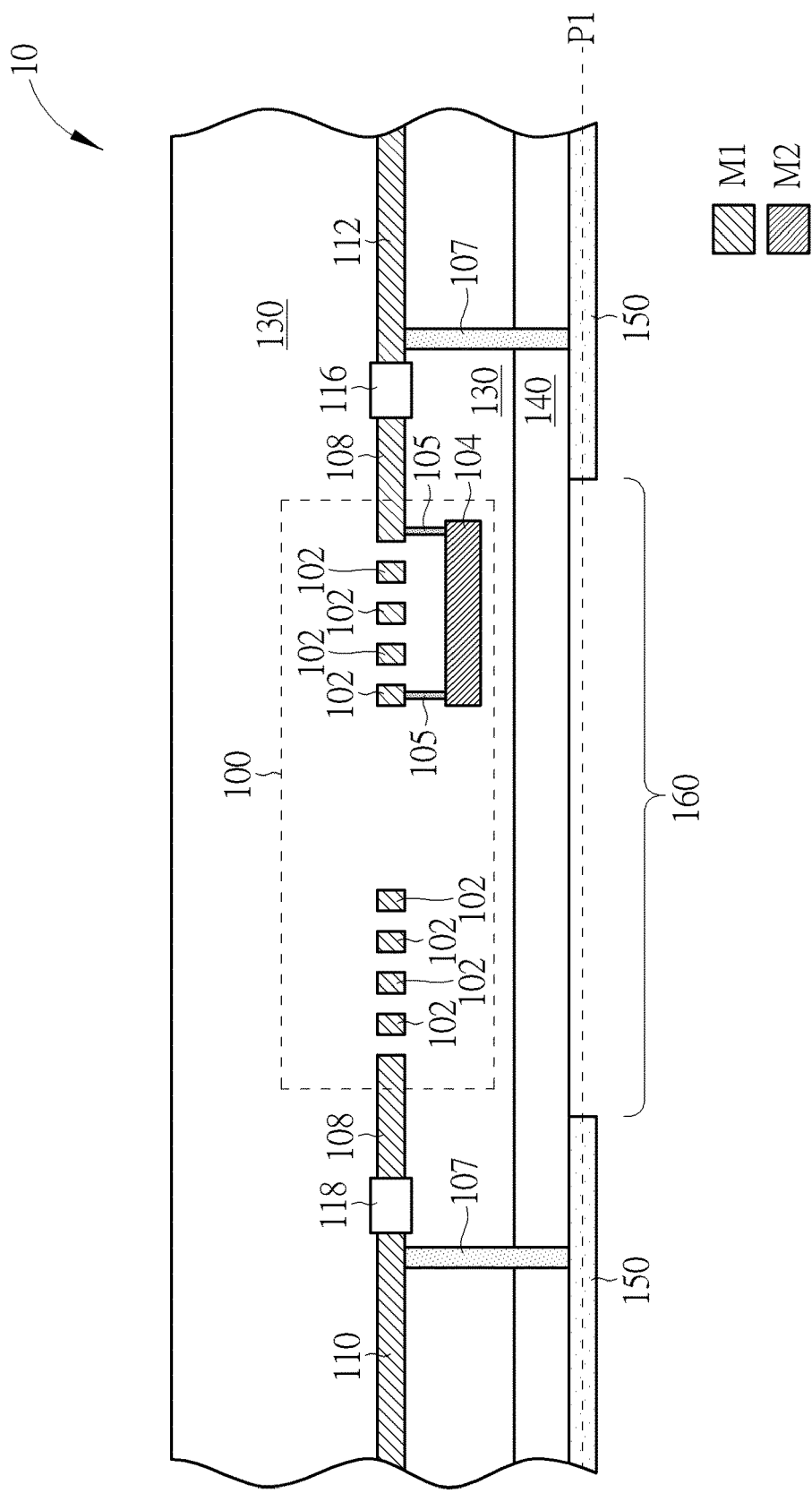
FIG. 2 is a schematic diagram of a cross-sectional view of the semiconductor device of FIG. 1.

Please refer to FIG. 1 and FIG. 2. FIG. 1 is a schematic diagram of a (top) layout view of a semiconductor device 10 according to an embodiment of the present invention. FIG. 2 is a schematic diagram of a cross-sectional view of the semiconductor device 10 along an A-A' line in FIG. 1. The semiconductor device 10 may be a radio frequency (RF) front-end module (FEM), which comprises a winding structure 100, a dielectric layer 130, a semiconductor substrate 140 and a backside metal 150. The dielectric layer 130 is formed on the semiconductor substrate 140, and the winding structure 100 is formed within the dielectric layer 130. The winding structure 100 may be an on-chip inductor, which is formed on a top side of the semiconductor substrate 140. The winding structure 100 comprises metal lines 102 and 104 winding around/with respect to a center of the winding structure 100 spirally.

The semiconductor substrate 140 may be made of a material such as gallium arsenide (GaAs) or silicon carbide (SiC). That is, one or more GaAs components, such as high electron mobility transistor (HEMT) or heterojunction bipolar transistor (HBT), may be formed within the semiconductor substrate 140. The backside metal 150 is formed under a backside of the semiconductor substrate 140, which may be utilized for providing grounding or signal path.

For illustrative purpose, the dielectric layer 130 and the semiconductor substrate 140 are neglected in FIG. 1, and only the winding structure 100 and the backside metal 150 are illustrated in FIG. 1. As shown in FIG. 1 and FIG. 2, a hollow slot 160 is formed within the backside metal 150, such that a projection of the winding structure 100 lies within the hollow slot 160. Notably, the winding structure 100 and the backside metal 150 are formed on different sides of the semiconductor substrate 140 (i.e., the winding structure 100 is on the top side and the backside metal 150 is under the backside of the semiconductor substrate 140), and the projection of the winding structure 100 (onto a plane P1 at which the backside metal 150 locates) lies within the hollow slot 160.

In the current embodiment, a shape of the hollow slot 160 is the same as a shape formed by the outmost metal line 102 of the winding structure 100. For example, the shape of the hollow slot 160 is a square (or a rectangle), and the shape formed by the outmost metal line 102 of the winding structure 100 is also a square (or a rectangle). In another perspective, an inner edge of the hollow slot 160 is parallel to a projection result of the outmost metal line 102 (of the winding structure 100) onto the plane P1 at which the backside metal 150 locates. In addition, the inner edge of the hollow slot 160 may be a distance away/outward from the projection result of the outmost metal line 102, such that an area of the hollow slot 160 is larger than an area surrounded by the outmost metal line 102 of the winding structure 100.

In another perspective, forming the hollow slot 160 is regarded as removing a part of backside metal underneath the winding structure 100, so as to obtain better energy storage efficiency of magnetic lines of force and to reduce energy loss in each oscillation cycle of electromagnetic wave delivered through the semiconductor device 10. That is, removing the backside metal by forming the hollow slot 160 underneath the winding structure 100 is able to achieve an effect of reducing energy loss caused by Eddy current. Thereby, a quality factor (Q factor) of the winding structure 100 is improved.

Figure 5:
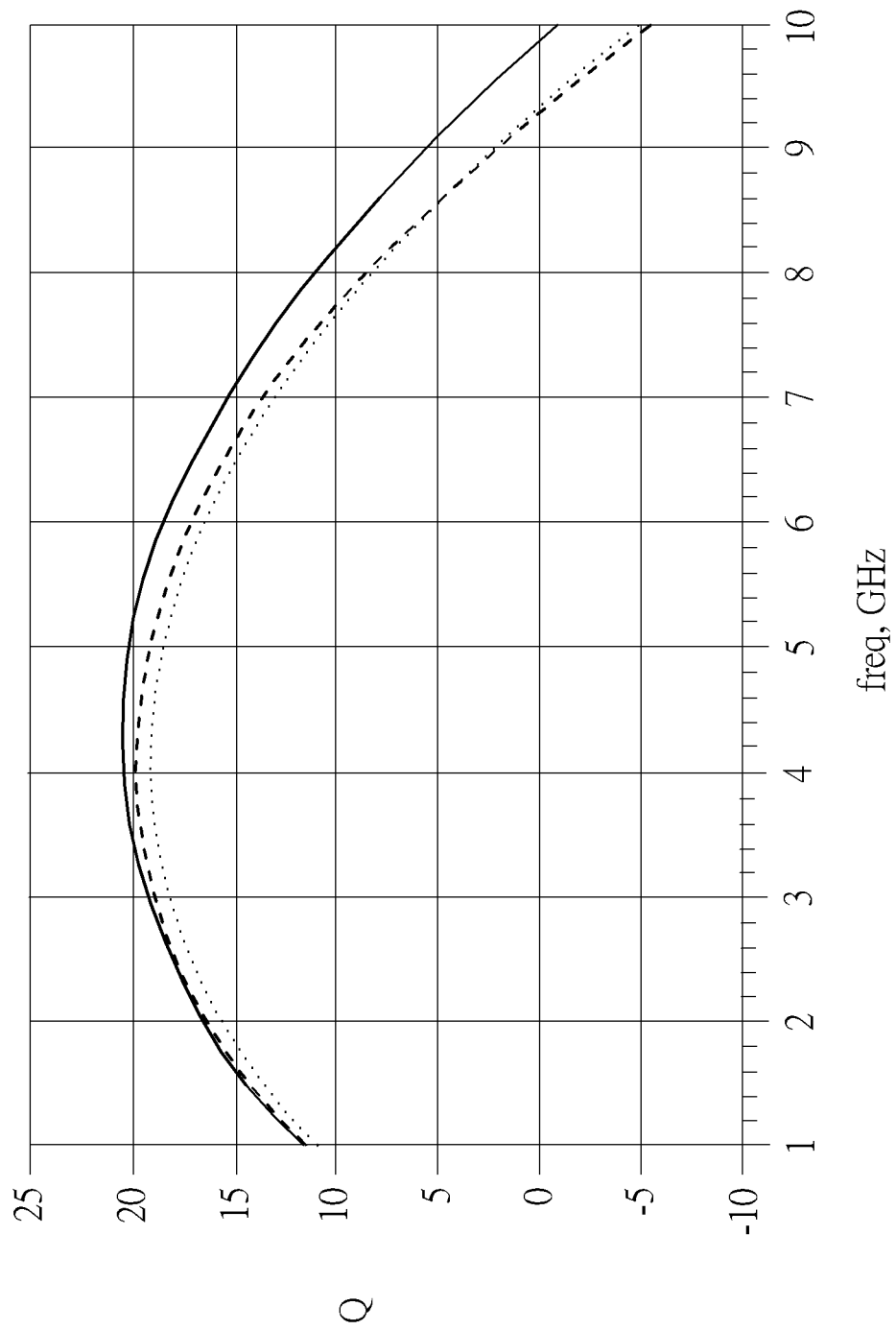
FIG. 5 illustrates curves of Q factors using different semiconductor devices.

Please refer to FIG. 5, which illustrates curves of Q factors using different semiconductor devices. In FIG. 5, a dotted line represents a curve of Q factor of a tradition GaAs semiconductor device with a 2 μm thick topside metal, a dashed line represents a curve of Q factor of a tradition GaAs semiconductor device with a 4 μm topside metal using an additional integrated passive device, and a solid line represents a curve of Q factor of the semiconductor device 10 removing backside metal underneath the winding structure 100, with a 2 μm thick topside metal. As can be seen from FIG. 5, the Q factor of the semiconductor device 10 is higher than other two, especially when the operating frequency of the semiconductor devices is higher than 6 GHz. Hence, there is no need to deploy any additional integrated passive device (IPD). That is, both production cost and area of the semiconductor device 10 are reduced.

In addition, in the winding structure 100, the metal lines 102 may be disposed in a metal layer M1, and the metal line 104 may be disposed in a metal layer M2. Vias 105, formed within the dielectric layer 130, are configured to connect the metal lines 102 in the metal layer M1 and the metal line 104 in the metal layer M2. The winding structure 100 may be connected to another circuit (e.g. circuits 116 or 118 illustrated in FIG. 2) within the semiconductor device 10 via terminals 108. The terminals 108 are also (topside) metal lines formed on the top side of the semiconductor substrate. Topside metals 110 and 112 within the semiconductor device 10 may be connected to the backside metal 150 vias 107 penetrating through the dielectric layer 130 and the semiconductor substrate 140. Apart of the backside metal 150 (e.g., the part of the backside metal 150 at the right hand side of the semiconductor device 10 in FIG. 2) may be configured for providing grounding, and another art of the backside metal 150 (e.g., the part of the backside metal 150 at the left hand side of the semiconductor device 10 of FIG. 2) may be configured for delivering an RF signal of the semiconductor device 10.

Figure 3:
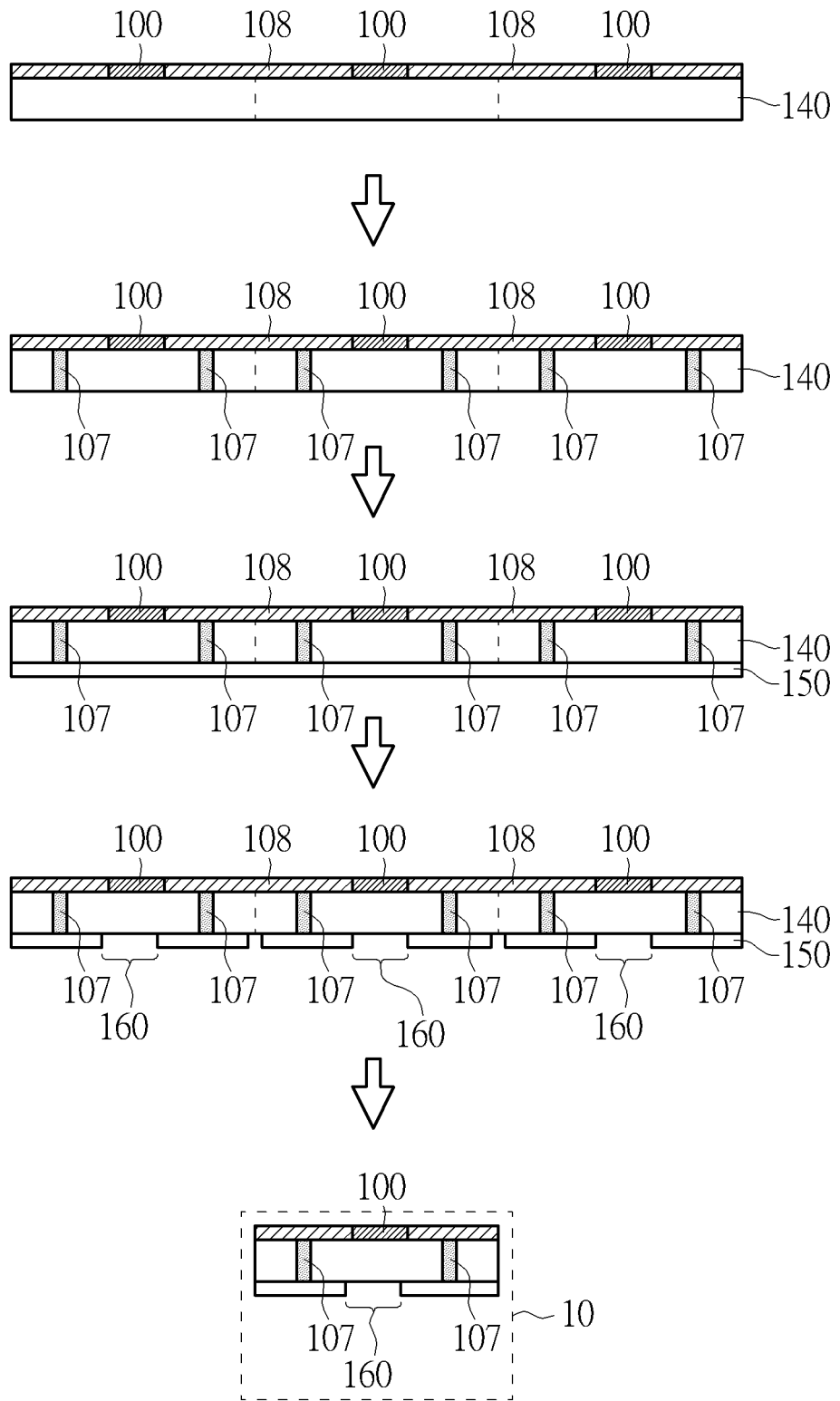
FIG. 3 is a schematic diagram of a manufacturing process according to an embodiment of the present invention.

Please refer to FIG. 3, which is a schematic diagram of a process of manufacturing the semiconductor device 10. First of all, the winding structure 100 and the top side pattern, e.g., the topside metal 108, are formed on the top side of the semiconductor substrate 140. For brevity, the dielectric layer 130 is neglected in FIG. 3.

Secondly, the vias 107 are formed within the semiconductor substrate 140. After the vias 107 are formed, the backside metal 150 is formed under the backside of the semiconductor substrate 140. Methods of forming the backside metal 150 are not limited. For example, the backside metal 150 may be formed via deposition, e.g., by electroless plating using gold (Au) or gold-tin alloy (AuSn).

After the backside metal 150 is formed, the hollow slots 160 is formed under the winding structure 100, which is regarded as removing the part of backside metal underneath the winding structure 100. Methods of forming the hollow slots 160 are not limited. For example, the hollow slots 160 may be formed by a technique which is utilized to form hot vias within GaAs semiconductor (i.e., a hot-via-forming process). After the hollow slots 160 are formed, a singulation process or a die sawing process is performed, such that manufacturing the semiconductor device 10 is accomplished.

Notably, the embodiments stated in the above are utilized for illustrating the concept of the present invention. Those skilled in the art may make modifications and alterations accordingly, and not limited herein. For example, the winding structure may be applied to be a transformer or a balun, which is within the scope of the present invention.

Figure 4:
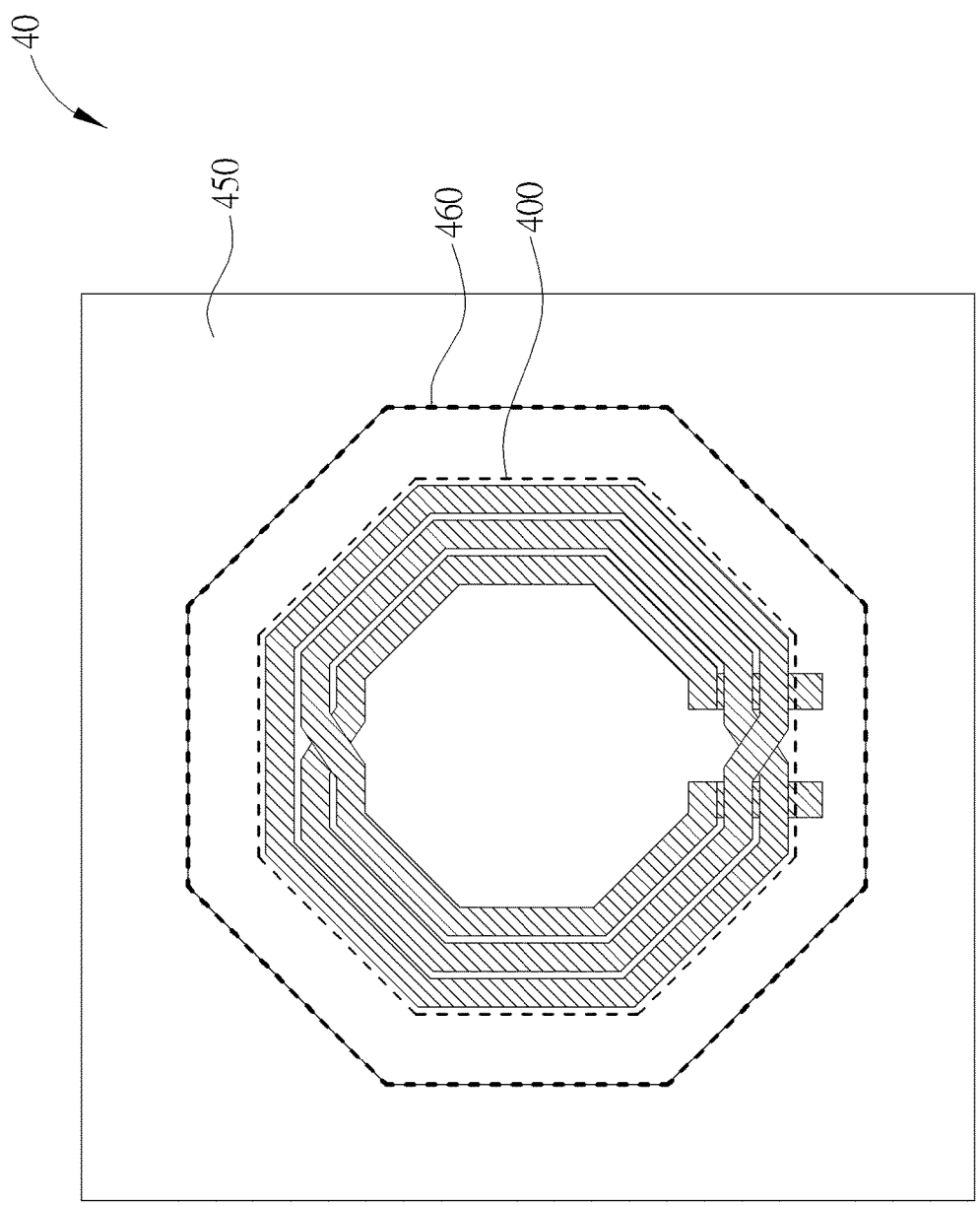
FIG. 4 is a schematic diagram of a layout view of a semiconductor device according to an embodiment of the present invention.

In addition, the shapes of the hollow slot and the winding structure are not limited to be a square or a rectangle. Please refer to FIG. 4, which is a schematic diagram of a (top) layout view of a semiconductor device 40 according to an embodiment of the present invention. In the semiconductor device 40, the shapes of a hollow slot 460 and a winding structure 400 are octagonal, which is also within the scope of the present invention.

Figure 6:
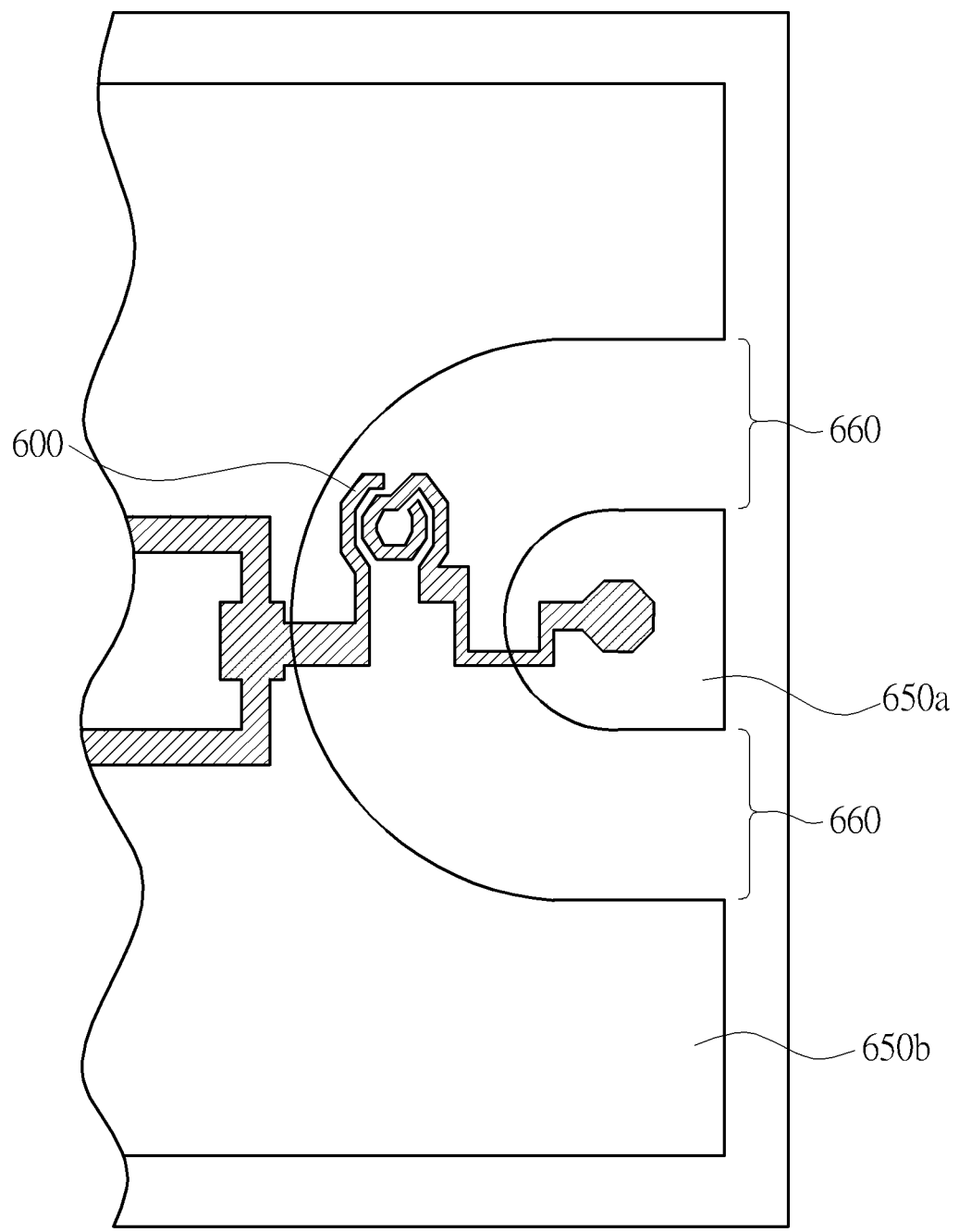
FIG. 6 is a schematic diagram of a layout view of a semiconductor device according to an embodiment of the present invention.

In addition, the shape of the hollow slot is not limited to be the same as the winding structure. Please refer to FIG. 6, which is a schematic diagram of a (top) layout view of a semiconductor device 60 according to an embodiment of the present invention. In the semiconductor device 60, a backside metal 650a with a smaller area is formed by an edge of the semiconductor device 60, and a backside metal 650b with a larger area is formed in a middle of the semiconductor device 60. The backside metal 650a may be served as a signal lead of the semiconductor device 60 for delivering an RF signal or a DC bias, and the backside metal 650b may be served as a ground lead of the semiconductor device 60 for providing grounding. A hollow slot 660 with semicircle edges is formed between the backside metal 650a (signal lead) and the backside metal 650b (ground lead). That is, a terminal of a winding structure 600 is connected to the backside metal 650a (signal lead) and another terminal of the winding structure 600 is connected to another circuit (e.g. circuits 116 or 118 illustrated in FIG. 2). As long as a projection of the winding structure 600 (onto a plane at which the backside metal 650a and 650b locate) lies within the hollow slot 660, requirements of the present invention are satisfied. In addition, in an embodiment, an area of the backside metal 650a may be larger than 50% of an area of the backside of the semiconductor device 60, and an area of the backside metal 650b may be smaller than 50% of the backside area of the semiconductor device 60. In an embodiment, an area of the hollow slot 660 may be smaller than 30% of the backside area of the backside of the semiconductor device 60. Preferably, a distance between an edge of the backside metal 650a and an edge of a via connecting the backside metal 650a is at least 30 um.

In summary, the present invention utilizes the hollow slot (formed with the backside metal) under the winding structure (formed on the top side of the semiconductor device) to avoid energy loss caused by Eddy current and improve Q factor. Compared to the prior art, both production cost and area are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
 a semiconductor substrate;

a winding structure formed on a top side the semiconductor substrate, wherein the winding structure comprises one or more metal lines winding with respect to a center of the winding structure; and a first backside metal and a second backside metal formed under a backside of the semiconductor substrate;

wherein a hollow slot is formed between the first backside metal and the second backside metal, and a projection of the winding structure is within the hollow slot;

wherein the first backside metal and the second backside metal forms a ground-signal-ground (GSG) structure;

wherein an edge of the hollow slot is a distance from a projection result of an outmost metal line of the winding structure.

2. The semiconductor device of claim 1, wherein the semiconductor substrate is made of Gallium Arsenide (GaAs) or Silicon Carbide (SiC).

3. The semiconductor device of claim 1, further comprising:

a dielectric layer formed on the semiconductor substrate;

wherein the winding structure is formed within the dielectric layer.

4. The semiconductor device of claim 3, wherein the one or more metal lines are disposed in multiple metal layers, and one or more first vias are formed within the dielectric layer to connect the one or more metal lines disposed in the multiple metal layers.

5. The semiconductor device of claim 1, wherein a high electron mobility transistor (HEMT) or a heterojunction bipolar transistor (HBT) is formed on the semiconductor substrate.

6. The semiconductor device of claim 1, wherein the winding structure is an inductor.

7. The semiconductor device of claim 1, wherein the winding structure is a transformer.

8. The semiconductor device of claim 1, wherein the winding structure is a balun.

9. The semiconductor device of claim 1, further comprising:

a topside metal formed on the top side the semiconductor substrate;

wherein a second via is formed within the semiconductor substrate to connect the topside metal with the backside metal.

10. The semiconductor device of claim 1, wherein a part of the backside metal is for providing grounding for the semiconductor device.

11. The semiconductor device of claim 10, wherein an area of the part of the backside metal for providing grounding is larger than 50% of an area of the backside of the semiconductor device.

12. The semiconductor device of claim 1, wherein a part of the backside metal is for delivering radio frequency (RF) signal or DC bias of the semiconductor device.

13. The semiconductor device of claim 12, wherein an area of the part of the backside metal for delivering RF signal is smaller than 50% of an area of the backside of the semiconductor device.

14. The semiconductor device of claim 1, wherein an area of the hollow slot is smaller than 30% of an area of the backside of the semiconductor device.

15. A manufacturing method of a semiconductor device, comprising:

forming a winding structure formed on a top side of a semiconductor substrate, wherein the winding structure comprises one or more metal lines winding with respect to a center of the winding structure, and the one or more metal lines are disposed in one or more metal layers;

forming a first backside metal and a second backside metal under a backside of the semiconductor substrate; and forming a hollow slot between the first backside metal and the second backside metal, wherein a projection area of the winding structure is within the hollow slot, and an edge of the hollow slot is a distance from a projection result of an outmost metal line of the winding structure;

wherein the first backside metal and the second backside metal forms a ground-signal-ground (GSG) structure.

16. The manufacturing method of claim 15, wherein the hollow slot is formed by a hot-via-forming process within the backside metal.

17. The semiconductor device of claim 9, wherein a distance between an edge of the backside metal and an edge of the second via is at least 30 um.

18. The semiconductor device of claim 1, wherein the GSG structure is formed at an edge of the semiconductor device.

19. The semiconductor device of claim 1, wherein the hollow slot has a same width at an edge of semiconductor device.

* * * * *